United States Patent
Kinyua

(10) Patent No.: US 10,778,237 B2
(45) Date of Patent: Sep. 15, 2020

(54) METHOD AND CIRCUIT FOR NOISE SHAPING SAR ANALOG-TO-DIGITAL CONVERTER

(71) Applicant: TAIWAN SEMICONDUCTOR MANUFACTURING COMPANY, LTD., Hsinchu (TW)

(72) Inventor: Martin Kinyua, Cedar Park, TX (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/943,732

(22) Filed: Nov. 17, 2015

(65) Prior Publication Data
US 2016/0072515 A1    Mar. 10, 2016

Related U.S. Application Data

(63) Continuation of application No. 14/328,328, filed on Jul. 10, 2014, now Pat. No. 9,197,240.

(51) Int. Cl.
| | |
|---|---|
| H03M 1/06 | (2006.01) |
| H03M 1/00 | (2006.01) |
| H03M 3/00 | (2006.01) |
| H03M 1/12 | (2006.01) |
| H03M 1/46 | (2006.01) |

(52) U.S. Cl.
CPC ......... *H03M 1/002* (2013.01); *H03M 1/0626* (2013.01); *H03M 1/1265* (2013.01); *H03M 3/426* (2013.01); *H03M 1/462* (2013.01); *H03M 1/468* (2013.01)

(58) Field of Classification Search
CPC ...... H03M 3/424; H03M 3/458; H03M 1/007; H03M 1/442; H03M 3/388; H03M 3/454; H03M 1/12; H03M 3/426; H03M 3/43; H03M 3/464; H03M 3/46; H03M 1/02; H03M 1/08; H03M 1/1009; H03M 1/38; H03M 1/468
USPC ................. 341/118, 120, 143, 155, 172, 144
See application file for complete search history.

(56) References Cited

U.S. PATENT DOCUMENTS

| | | |
|---|---|---|
| 5,311,181 A | 5/1994 | Ferguson et al. |
| 6,970,120 B1 | 11/2005 | Bjornsen |
| 7,224,305 B2 | 5/2007 | Haartsen |

(Continued)

OTHER PUBLICATIONS

Liu, Chun Cheng et al., "A 1V 11fJ/Converesion-Step 10bit 10MS/s Asynchronous SAR ADC in 0.18um CMOS", 2010 Symposium on VLSI Circuits/Technical Digest of Technical Papers, pp. 241-242.

(Continued)

*Primary Examiner* — Linh V Nguyen
(74) *Attorney, Agent, or Firm* — Hauptman Ham, LLP

(57) ABSTRACT

An analog-to-digital (A/D) conversion system includes a track-and-hold circuit, a digital-to-analog (D/A) conversion circuit, a comparison circuit and a control circuit. The track-and-hold circuit is configured to output a first signal based on an input signal. The D/A conversion circuit is configured to generate a second signal based on an N-bit logical signal. The comparison circuit is configured to generate a comparison result based on the first signal and the second signal. The control circuit is configured to generate the N-bit logical signal according to N comparison results from the comparison circuit.

20 Claims, 9 Drawing Sheets

(56) References Cited

U.S. PATENT DOCUMENTS

| | | | | |
|---|---|---|---|---|
| 7,439,898 B1* | 10/2008 | Nittala | ............ | H03M 1/462 |
| | | | | 341/155 |
| 8,102,292 B1* | 1/2012 | Van Ess | ............ | H03M 3/426 |
| | | | | 341/143 |
| 8,462,038 B2 | 6/2013 | Furuta | | |
| 8,749,412 B1 | 6/2014 | Tsai | | |
| 8,933,830 B1 | 1/2015 | Jeon | | |
| 8,933,930 B2* | 1/2015 | Han | ............ | G05B 15/02 |
| | | | | 345/419 |
| 9,197,240 B1* | 11/2015 | Kinyua | ............ | H03M 1/002 |
| 2005/0093726 A1 | 5/2005 | Hezar et al. | | |
| 2007/0222656 A1* | 9/2007 | Melanson | ............ | H03M 3/39 |
| | | | | 341/155 |
| 2007/0222657 A1* | 9/2007 | Melanson | ............ | H03M 1/0673 |
| | | | | 341/155 |
| 2007/0247341 A1* | 10/2007 | Liu | ............ | H03M 3/32 |
| | | | | 341/143 |
| 2008/0186214 A1* | 8/2008 | Janakiraman | ............ | H03M 1/0809 |
| | | | | 341/110 |
| 2008/0272944 A1* | 11/2008 | Zhou | ............ | H03M 3/352 |
| | | | | 341/143 |
| 2011/0075768 A1* | 3/2011 | Zhan | ............ | H03M 1/46 |
| | | | | 375/340 |
| 2011/0133971 A1* | 6/2011 | Ogawa | ............ | H03M 1/0678 |
| | | | | 341/155 |
| 2011/0267211 A1* | 11/2011 | Oshima | ............ | H03M 1/1038 |
| | | | | 341/118 |
| 2012/0001781 A1* | 1/2012 | Scanlan | ............ | H03M 1/1004 |
| | | | | 341/110 |
| 2012/0112943 A1 | 5/2012 | Lin et al. | | |
| 2012/0326901 A1* | 12/2012 | Zhao | ............ | H03M 1/0604 |
| | | | | 341/118 |
| 2014/0070972 A1* | 3/2014 | Morgado | ............ | H03M 3/32 |
| | | | | 341/143 |
| 2014/0210653 A1* | 7/2014 | Harpe | ............ | H03M 1/08 |
| | | | | 341/110 |
| 2014/0266827 A1* | 9/2014 | Ceballos | ............ | H03M 3/418 |
| | | | | 341/143 |
| 2014/0266847 A1* | 9/2014 | Shen | ............ | H03M 1/38 |
| | | | | 341/158 |

OTHER PUBLICATIONS van Elzakker, Michiel et al., "A 10-bit Charge-Redistribution ADC Consuming 1.9 uW at 1 MS/s", IEEE Journal of Solid State Circuits, vol. 45, No. 5, May 2010, pp. 1007-1015.

* cited by examiner

METHOD AND CIRCUIT FOR NOISE SHAPING SAR ANALOG-TO-DIGITAL CONVERTER

PRIORITY CLAIM

The present application is a continuation of U.S. application Ser. No. 14/328,328, filed Jul. 10, 2014, now U.S. Pat. No. 9,197,240, issued Nov. 24, 2015, which is incorporated herein by reference in its entirety.

BACKGROUND

An analog-to-digital converter (ADC) is usable to convert analog signals to digital signals. There are a variety of ADC architectures, such as pipelined, flash, Sigma-Delta, and successive approximation register (SAR). In some applications, an achievable conversion resolution of an ADC is limited by for example thermal noises, electrical noises, and/or mismatch of various electrical components of the ADC. For example, in some SAR ADC applications, the conversion resolution of an SAR ADC depends on the noises and accuracy of an SAR comparator of the SAR ADC. In some applications, the SAR comparator is configured to consume more power and/or occupy a greater area in order to obtain improved conversion resolution.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
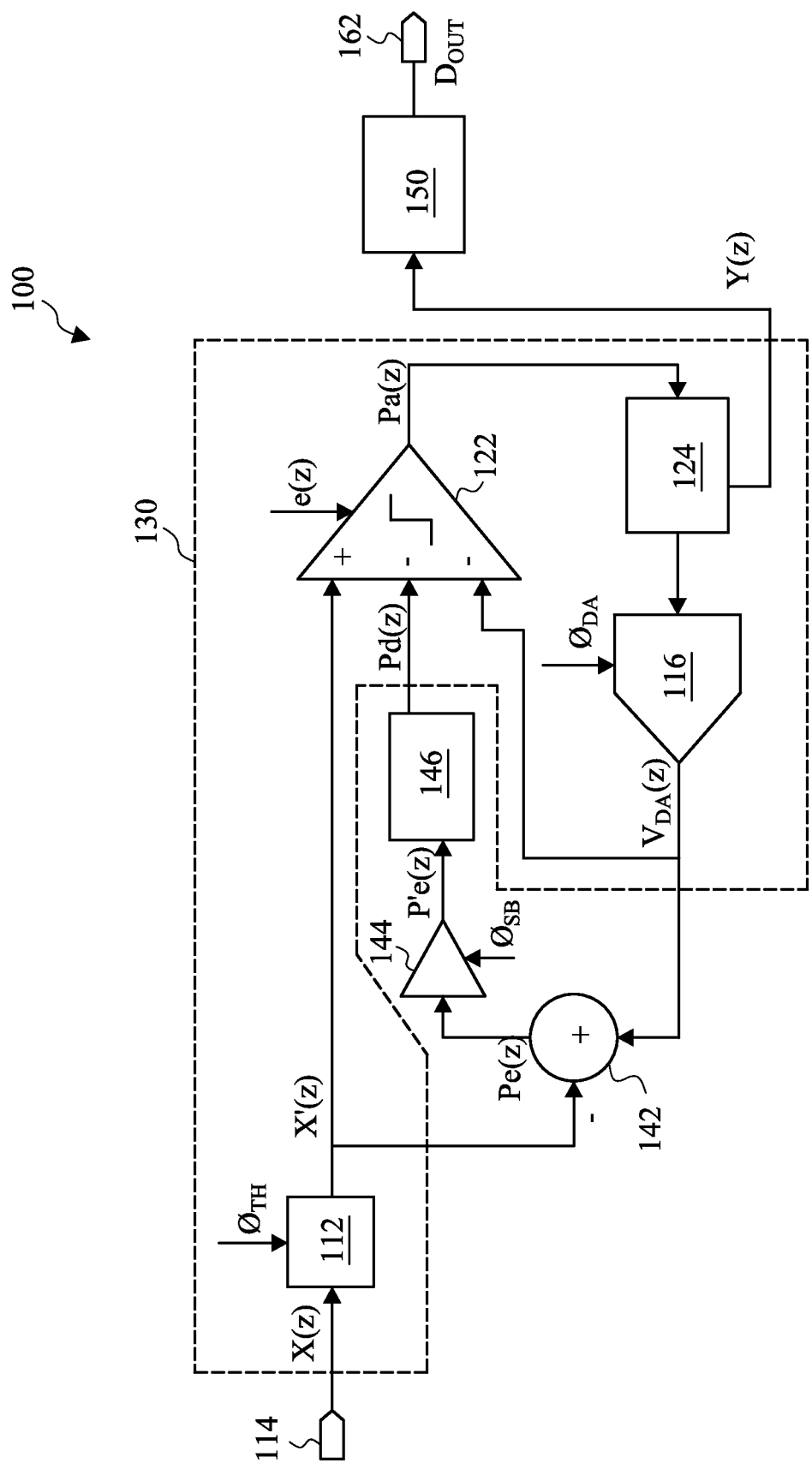
FIG. 1 is a Z-domain functional block diagram of an analog-to-digital conversion system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, by modifying an SAR analog-to-digital converter (ADC) to incorporate a noise-shaping filter and an output filter, an equivalent resolution of the final digital output becomes less dependent on the accuracy of a comparator of the SAR ADC. In some embodiments, the final digital output has a bit resolution greater than the base SAR ADC. For example, an ADC according to the present application using a 7-bit SAR ADC as the base ADC is configurable to output a 9, 10, or greater bit digital output. Additionally and optionally, the resulting ADC is operated in an oversampling manner to further increase the equivalent resolution or accuracy of the final digital output.

FIG. 1 is a Z-domain functional block diagram of an analog-to-digital (A/D) conversion system 100 in accordance with some embodiments. FIG. 1 is used to illustrate the configuration and operation of an A/D conversion system 100 from a system analysis perspective using Z-domain expressions and various functional blocks. There are many approaches to implement an A/D conversion circuit based on A/D conversion system 100.

A/D conversion system 100 includes a track-and-hold unit 112 coupled to an input terminal 114, a digital-to-analog (D/A) conversion unit 116, a comparison unit 122 coupled to track-and-hold unit 112 and D/A conversion unit 116, and a control unit 124 coupled to comparison unit 122 and D/A conversion unit 116. A dashed box 130 encircles track-and-hold unit 112, D/A conversion unit 116, comparison unit 122, and control unit 124. Dashed box 130 contains elements having characteristics corresponding to an SAR ADC. Therefore, an existing or later-developed SAR ADC is suitable to be modified to implement the functional blocks within dashed box 130.

A/D conversion system 100 further includes a coupling unit 142 coupled to track-and-hold unit 112 and D/A conversion unit 116, a switched buffer 144 coupled to coupling unit 142, and a loop filter 146 coupled to switched buffer 144 and comparison unit 122. Moreover, A/D conversion system 100 includes an output filter 150 coupled to control unit 124, and an output terminal 162. In some embodiments, track-and-hold unit 112, D/A conversion unit 116, comparison unit 122, control unit, and coupling unit 142 correspond to one or more circuitries including various types of electrical components.

Figure 2:
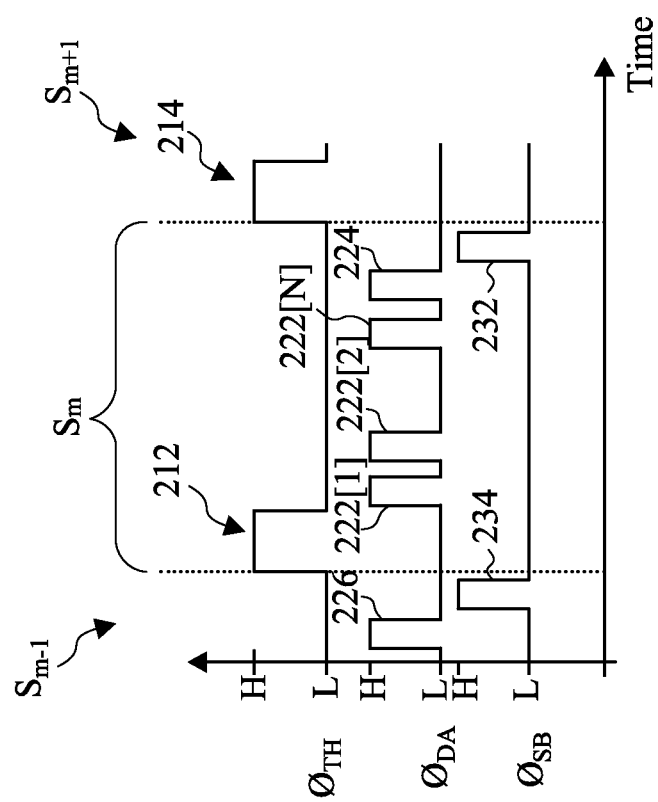
FIG. 2 is a timing diagram of various timing signals in an analog-to-digital conversion system in accordance with some embodiments.

Track-and-hold unit 112 is configured to sample an input signal, represented by Z-domain expression X(z), as the input value having Z-domain expression X'(z) if timing signal $\varphi_{TH}$ is activated during sampling cycle $S_m$ (FIG. 2). Track-and-hold unit 112 is also configured to hold the input value X'(z) after the input value is sampled and timing signal $\varphi_{TH}$ is deactivated during sampling cycle $S_m$. In some embodiments, track-and-hold unit 112 includes one or more capacitive devices coupled with one or more corresponding switches configured to track-and-hold a voltage level of input signal X(z).

Comparison unit 122 is configured to generate a comparison result having a z-domain expression Pa(z) based on a polarity, e.g., positive or negative, of a combined value. The combined value is based on an input value X'(z) minus the summation of a feedback value having Z-domain expression $V_{DA}(z)$ and a filtered residue (quantization error signal) value Pd(z). Comparison result having Z-domain expression Pa(z) inherently incorporate a conversion error signal represented by Z-domain expression e(z). In some embodiments, error signal e(z) includes one or more errors caused by thermal noises, electrical noises, A/D quantization noises, and the mismatch of electrical components that are used to implement comparison unit 122. In some embodiments, comparison unit 122 includes a comparator and corresponding peripheral circuit configured to couple the input values to the comparator.

Control unit 124 is configured to receive N comparison results from the comparison unit 122 during a sampling cycle $S_m$, if the SAR ADC is an N-bit SAR ADC, where N is a positive number. In some embodiments, N ranges from 4 to 16. Control unit 124 also set an N-bit logical value according to the N comparison results. The N-bit logical value is set to be a digital representation of the input value X(z), with inclusion of shaped error signal e(z). The sampling cycle $S_m$ corresponds to a sampling frequency Fs. For the system analysis of A/D conversion system 100 based on the sampling frequency Fs, the final N-bit logical value of each sampling cycle collectively constitute a digital signal having a Z-domain expression of Y(z). In some embodiments, control unit 124 includes a logical circuitry, a processor executing a set of instructions, or a combination thereof.

Moreover, control unit 124 controls the timing of the operation of track-and-hold unit 112, D/A conversion unit 116, and switched buffer 144. The timing is represented by various timing signals $\varphi_{TH}$, $\varphi_{DA}$, and $\varphi_{SB}$. In some embodiments, timing signals $\varphi_{TH}$, $\varphi_{DA}$, and $\varphi_{SB}$ are used to illustrate the operations of various functional blocks of A/D conversion system 100 from the system analysis perspective and are thus not all literally present in an circuit implementation of A/D conversion system 100.

D/A conversion unit 116 is configured to generate the feedback value $V_{DA}(z)$ based on an N-bit logical value stored in or accessible to control unit 124. During sampling cycle $S_m$, D/A conversion unit 116 is set by control unit 124 to generate feedback value $V_{DA}(z)$ and to output the feedback value $V_{DA}(z)$ if timing signal $\varphi_{DA}$ is activated. In some embodiments, feedback value $V_{DA}(z)$ is a reconstruction value of the N-bit logical value. During sampling cycle $S_m$, timing signal $\varphi_{DA}$ is activated for (N+1) times after the input value X'(z) is sampled and held by track-and-hold unit 112. In some embodiments, for each one of the first N times of activation of timing signal $\varphi_{DA}$, control unit 124 set a corresponding bit of the N-bit logical value according to the comparison result Pa(z). Control unit 124 thus confirms or updates the N-bit logical value every time control unit 124 receives a comparisons result Pa(z). Accordingly, D/A conversion unit 116 updates the feedback value $V_{DA}(z)$, and comparison unit 122 updates the comparison result Pa(z) responsive to each one of the first N times of activation of timing signal $\varphi_{DA}$. In some embodiments, D/A conversion unit 116 includes one or more capacitive devices coupled with one or more corresponding switches configured to reconstruct the N-bit logical value in the form of a voltage level or a set of redistributed charges representing the reconstructed voltage level.

At the end of the first N times of activation of timing signal $\varphi_{DA}$, the N-bit logical value is set to be the digital representation of the input value X'(z) with inclusion of a high pass filtered error signal e(z). For the (N+1)-th time of activation of timing signal $\varphi_{DA}$, D/A conversion unit 116 is set by control unit 124 to generate a feedback value $V_{DA}(z)$ that is a reconstructed value of the final N-bit logical value of sampling cycle $S_m$. For the system analysis of A/D conversion system 100 based on the sampling frequency Fs, the reconstructed value also has a Z-domain expression $V_{DA}(z)$.

Coupling unit 142 is configured to generate an error signal value Pe(z) based on the input signal X'(z) and the feedback value as represented by reconstructed signal $V_{DA}(z)$. The generation of error signal value Pe(z) depends on the availability of reconstructed signal $V_{DA}(z)$, and thus error signal value Pe(z) of sampling cycle $S_m$ is available after control unit 124 receives N comparison results. In some embodiments, coupling unit 142 includes one or more capacitive devices coupled with one or more corresponding switches configured to combine various values by a charge redistribution approach.

Switched buffer 144 is configured to sample error signal value Pe(z) as a sampled error signal value P'e(z) if a timing signal $\varphi_{SB}$ is activated during sampling cycle $S_m$.

Loop filter 146 is configured to generate the filtered error signal value Pd(z) based on the sampled error signal value P'e(z). For the system analysis of A/D conversion system 100 based on the sampling frequency Fs, loop filter 146 has a Z-domain transfer function L(z).

For the system analysis of A/D conversion system 100 based on the sampling frequency Fs, the signals X(z) and Y(z) are thus has the following relationship:

$$Y(z) = X(z) + e(z)\frac{1}{1+L(z)}.$$

Therefore, the error signal e(z) is shaped by loop filter L(z) to have achieve predetermined noise-shaping characteristics having a noise shaping transfer function NTF(z):

$$NTF(z) = \frac{1}{1+L(z)}.$$

In some embodiments, loop filter L(z) is configured in a manner that noise shaping transfer function NTF(z) is a high-pass filter. Therefore, noise signal e(z) is suppressed, or shaped, within a frequency band of interest. After further signal processing, by using output filtering 150 for example, to remove the frequency components out of the frequency band of interest, the overall resolution of the final output digital signal is improved in comparison with that of the N-bit logical values Y(z).

Output filtering 150 receives signal Y(z) and generate an output signal $D_{OUT}$ at output terminal 162 based on signal Y(z). In some embodiments, during an output cycle, output filtering 150 generates an output logical value based on a plurality of N-bit logical values from the control unit 124, where each one of the plurality of N-bit logical values corresponding to a different sampling cycle. In some embodiments, signal Y(z) is low-pass filtered by output filtering 150 in order to remove or suppress the noise-shaped error signal e(z) from output signal $D_{OUT}$. In some embodiments, signal Y(z) is also down-sampled by output filtering 150. In some embodiments, the output cycle corresponds to an output frequency $F_{OUT}$. In some embodiments, a ratio of the sampling frequency Fs to the output frequency $F_{OUT}$ is equal to or greater than 2 (i.e., oversampled). In some embodiments, the ratio of the sampling frequency Fs to the output frequency $F_{OUT}$ is equal to or less than 4.

Because the error signal e(z) is shaped and removed output the frequency band of interest in A/D conversion system 100, error signal e(z) does not have to be less than the N-bit resolution in order to ensure A/D conversion system 100 has the N-bit accuracy. Moreover, in some embodiments, signal X(z) is oversampled to offer additional information for noise shaping and noise reduction. The accuracy requirement of the circuit implementation of comparison unit 122 is thus decoupled from the accuracy requirement of the N-bit resolution. In other words, the circuit implementation of comparison unit 122 does not have to be as accurate as required by an N-bit SAR ADC without noise shaping. Therefore, in some embodiments, even the circuit implementation of comparison unit 122 occupies less area, consumes less power, and does not have N-bit resolution accuracy, the overall A/D conversion system 100 still reaches N-bit resolution accuracy.

In some embodiments, output signal $D_{OUT}$ is an N-bit digital signal. In some embodiments, output signal $D_{OUT}$ is a (N+M)-bit digital signal, where M is a non-negative integer. Using the noise-shaping and/or oversampling architecture as illustrated above, in some embodiments, output digital signal $D_{OUT}$ has a (N+M)-bit resolution accuracy greater than N-bit resolution by using an N-bit SAR ADC as the core ADC (e.g., 130).

FIG. 2 is a timing diagram of various timing signals $\varphi_{TH}$, $\varphi_{DA}$, and $\varphi_{SB}$, in an analog-to-digital conversion system, such as system 100, in accordance with some embodiments. As depicted in FIG. 2 and FIG. 1, for sampling cycle $S_m$, timing signal $\varphi_{TH}$ is first activated at a track-and-sample stage as indicated by pulse 212 in order to cause the generation of input value X'(z) by track-and-hold unit 112. For sampling cycle $S_m$, timing signal $\varphi_{DA}$ is subsequently activated for (N+1) times as indicated by pulses 222[1], 222[2], 222[N], and 224. The first N times of activation as indicated by pulses 222[1], 222[2], and 222[N] are also referred to as a conversion stage. For each of the pulses 222[1], 222[2], and 222[N], D/A conversion unit 116 and is caused to generate feedback values $V_{DA}(z)$ based on N-bit logical value as kept by or accessible to control unit 124, and control unit 124 thus receives N corresponding comparison results Pa(z). The (N+1)-th time activation of timing signal $\varphi_{DA}$ corresponds to a first part of a residue voltage generation stage as indicated by pulse 224, where error signal value Pe(z) is generated.

Timing signal $\varphi_{SB}$ is activated after pulse 224 and corresponds to a second part of a residue voltage generation stage. Timing signal $\varphi_{SB}$ is activated to cause the generation of filtered error signal value Pd(z) for being used in the next sampling cycle $S_{m+1}$. The next sampling cycle $S_{m+1}$ then starts with pulse 214 and other pulses in a manner similar to the operations caused by pulses 212, 222[1], 222[2], 222[N], 224, and 232 during sampling cycle $S_m$. The filtered error signal value Pd(z) used in the sampling cycle $S_m$ is generated during the previous sampling cycle $S_{m-1}$ in response to pulses 226 and 234 in a manner similar to the operations caused by pulses 224 and 232 during sampling cycle $S_m$.

Timing signals $\varphi_{TH}$, $\varphi_{DA}$, and $\varphi_{SB}$ illustrated in FIG. 2 are depicted for system level analysis purposes and are not all literally present in an A/D conversion circuit based on system 100. For example, depending on the circuit implementation of track-and-hold unit 112, D/A conversion unit 116, and switched buffer 144, each timing signals $\varphi_{TH}$, $\varphi_{DA}$, and $\varphi_{SB}$ are implemented as one or more control signals to activate or deactivate corresponding electrical components consistent with $\varphi_{TH}$, $\varphi_{DA}$, and $\varphi_{SB}$ in FIG. 2. In some embodiments, one or more of timing signals $\varphi_{TH}$, $\varphi_{DA}$, and $\varphi_{SB}$ are omitted or merged in the circuit implementation.

Figure 3:
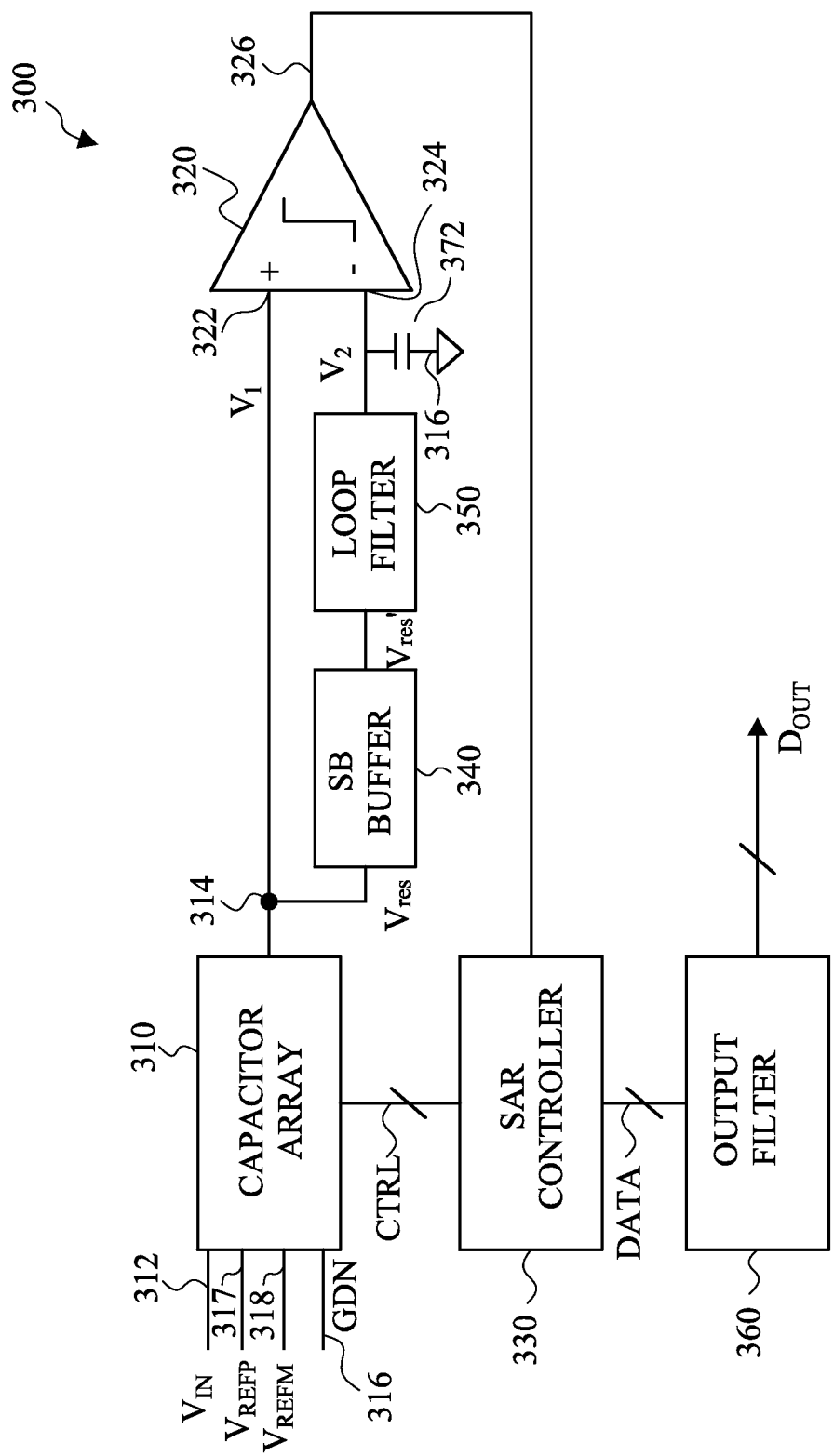
FIG. 3 is a circuit diagram of an analog-to-digital conversion circuit in accordance with some embodiments.

FIG. 3 is a circuit diagram of an analog-to-digital (A/D) conversion circuit 300 in accordance with some embodiments. A/D conversion circuit 300 is an example circuit implementation of A/D conversion system 100. The operation of circuit 300 is consistent with the operation of system 100.

A/D conversion circuit 300 includes a capacitor array 310, a comparator 320 coupled to capacitor array 310, an SAR controller 330 coupled to capacitor array 310 and comparator 320, a switched buffer 340 coupled to capacitor array 310, a loop filter 350 coupled between switched buffer 340 and comparator 320, an output filter 360 coupled to SAR controller 330, and a hold-up capacitive device 372 coupled to loop filter 350 and comparator 320.

In some embodiments, a combination of capacitor array 310, comparator 320, and SAR controller 330 corresponds to a basic configuration of an N-bit SAR ADC. In some embodiments, track-and-hold unit 112, D/A conversion unit 116, coupling unit 142, and a portion of comparison unit 122 in FIG. 1 are integrally implemented as capacitor array 310. In some embodiments, SAR controller 330 corresponds to control unit 124 in FIG. 1, switched buffer 340 corresponds to switched buffer 144, loop filter 350 corresponds to loop filter 146, and output filter 360 corresponds to output filtering 150.

Capacitor array 310 includes an input node 312, an output node 314, a power supply node 316, a first reference node 317, and a second reference node 318. Input node 312 is configured to receive an input signal $V_{IN}$. In some embodiments, input signal $V_{IN}$ corresponds to input signal X(z) in FIG. 1. Power supply node 316 is configured to receive a supply reference voltage. In some embodiments, the supply reference voltage is usable for defining ground GND of circuit 300. First reference node 317 is configured to receive a first reference voltage $V_{REFP}$, and second reference node 318 is configured to receive a second reference voltage $V_{REFM}$. In some embodiments, a voltage level of the second reference voltage $V_{REFM}$ is lower than a voltage level of the first reference voltage $V_{REFP}$.

Capacitor array 310 is configured to generate a first voltage V1 at node 314 for being used by comparator 320 to generate N comparison results during a sampling cycle, such as sampling cycle $S_m$. SAR controller 330 receives and set an N-bit logical value according to the N comparison results. The N-bit logical value is a digital representation of input signal $V_{IN}$ sampled during the sampling cycle $S_m$. Capacitor array 310 is also configured to generate a residue voltage Vres at node 314 after causing comparator 320 to generate N comparison results during the sampling cycle. Residue voltage Vres corresponds to a difference of input signal $V_{IN}$ and a reconstructed voltage level based on the N-bit logical value. Details of capacitor array 310 are further illustrated in conjunction with FIG. 4.

Comparator 320 includes a non-inverted input node 322, an inverted input node 324, and an output node 326. Output node 326 is coupled to SAR controller 330. Non-inverted input node 322 is coupled to output node 314 of capacitor array 310. Inverted input node 324 is coupled to loop filter 350 and a first end of hold-up capacitive device 372. A second end of hold-up capacitive device 372 is coupled to power supply node 316. Comparator 320 is configured to generate a comparison result at output node 326 based on first voltage V1 and a second voltage V2 at inverted input node 324. In the embodiment depicted in FIG. 3, first voltage V1 is generated by capacitor array 310 and corresponds to a difference between an input voltage level (e.g., X'(z) in FIG. 1) of the input signal Vin and an N-bit logical value (e.g., $V_{DA}(z)$ in FIG. 1) stored in or accessible to SAR controller 330. Second voltage V2 is generated by loop filter 350, held by hold-up capacitive device 372, and corresponds to a filtered residue voltage level (e.g., error signal value Pd(z) in FIG. 1) of a residue voltage Vres from a previous sampling cycle.

Switched buffer 340 is configured to sample and hold a residue voltage level Vres' based on a residue voltage Vres from the capacitor array 310. In some embodiments, switched buffer 340 includes a switch (e.g., switch 342 in FIG. 5A) and a buffer (e.g., buffer 344 in FIG. 5A). In some embodiments, buffer 344 includes a hold-up capacitor and/or a source-follower amplifier. Loop filter 350 is configured to generate a filtered residue voltage level (i.e., the voltage level of voltage V2) based on a residue voltage level Vres'.

SAR controller 330 is configured to control capacitor array 310 through a set of control signals CTRL in order to cause voltage V1 or voltage V2 to be set based on the N-bit logical value. SAR controller 330 controls the effectively equivalent SAR ADC to output the N-bit logical value (labeled as digital signal DATA) to output filter 360 and to cause capacitor array 310 to generate the residue voltage level Vres for the next sampling cycle after the SAR controller receives N comparison results from the comparator during the current sampling cycle. In some embodiments, digital signal DATA corresponds to digital signal Y(z).

Output filter 360 is configured to, during an output cycle, generate an output logical value $D_{OUT}$ based on a plurality of N-bit logical values from the SAR controller 330. In some embodiments, signal DATA is low-pass filtered by output filter 360. In some embodiments, signal DATA is also down-sampled by output filter 360. In some embodiments, the output cycle corresponds to an output frequency $F_{OUT}$. In some embodiments, a ratio of the sampling frequency Fs to the output frequency $F_{OUT}$ is equal to or greater than 2. In some embodiments, the ratio of the sampling frequency Fs to the output frequency $F_{OUT}$ is equal to or less than 4.

In some embodiments, when the effectively equivalent SAR ADC corresponds to an N-bit SAR ADC, output logical value $D_{OUT}$ is an (N+M)-bit logical value. In some embodiments, when N ranges 6 to 8, M ranges 2 to 16.

Figure 4:
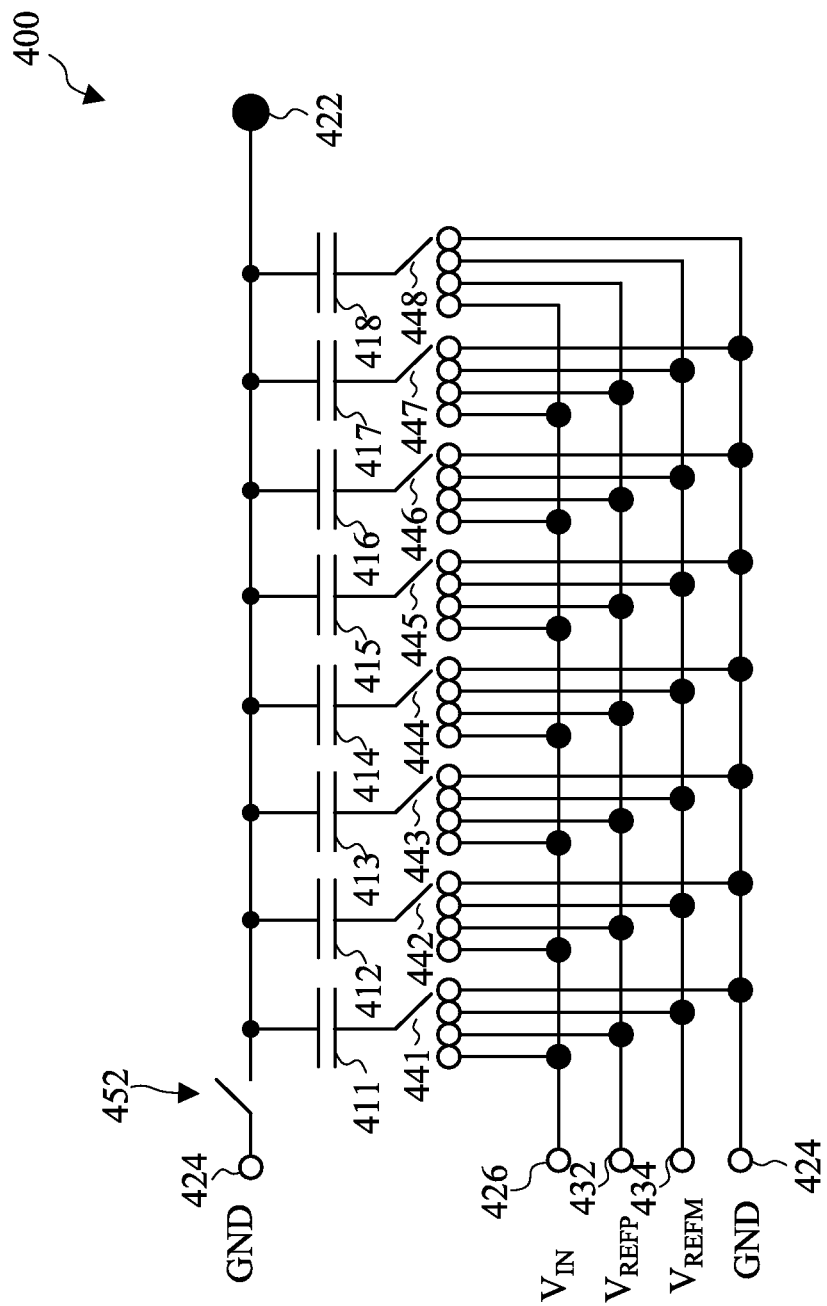
FIG. 4 is a circuit diagram of a capacitor array unit usable in an analog-to-digital conversion circuit in accordance with some embodiments.

FIG. 4 is a circuit diagram of a capacitor array 400 usable in an analog-to-digital conversion circuit, such as capacitor array 310 in circuit 300 in FIG. 3, in accordance with some embodiments. In the embodiment depicted in FIG. 4, capacitor array 400 is usable in a 7-bit SAR ADC.

Capacitor array 400 includes 8 capacitive devices 411, 412, 413, 414, 415, 416, 417, and 418. Capacitive device 411 has a capacitance value of C, and C is a predetermined capacitance value. Capacitive devices 412-418 have capacitance values of $$\frac{C}{2}, \frac{C}{4}, \frac{C}{8}, \frac{C}{16}, \frac{C}{32}, \frac{C}{64}, \frac{C}{128}, \text{ and } \frac{C}{128},$$

respectively. In some embodiments, for a given number N, capacitor array 400 includes (N+1) capacitive devices. An n-th capacitive devices of the (N+1) capacitive devices has a capacitance value of $$\frac{C}{2^{(n-1)}},$$

and an (N+1)-th capacitive device has a capacitance value of $$\frac{C}{2^{(N-1)}},$$

where n is a positive integer ranging from 1 to N.

Capacitor array 400 further includes an output node 422 coupled to first ends of capacitive devices 411-418, a power supply node 424, an input node 426, a first reference node 432, a second reference node 434, (N+1) switching devices 441, 442, 443, 444, 445, 446, 447, and 448, and another switching device 452. Output node 422, power supply node 424, input node 426, first reference node 432, and second reference node 424 variously correspond to output node 314, power supply node 316, input node 312, first reference node 317, and second reference node 318 in FIG. 3. Detail description thereof is thus omitted.

Switching devices 441-448 and switching device 452 are controlled by an SAR controller, such as by SAR controller 330 through control signals CTRL in FIG. 3. Each switching device 441-448 is configured to selectively couple a corresponding second end of the capacitive devices 411-418 to input node 426, first reference node 432, and second reference node 424, and power supply node 424 responsive to the control signals CTRL.

Figure 5A:
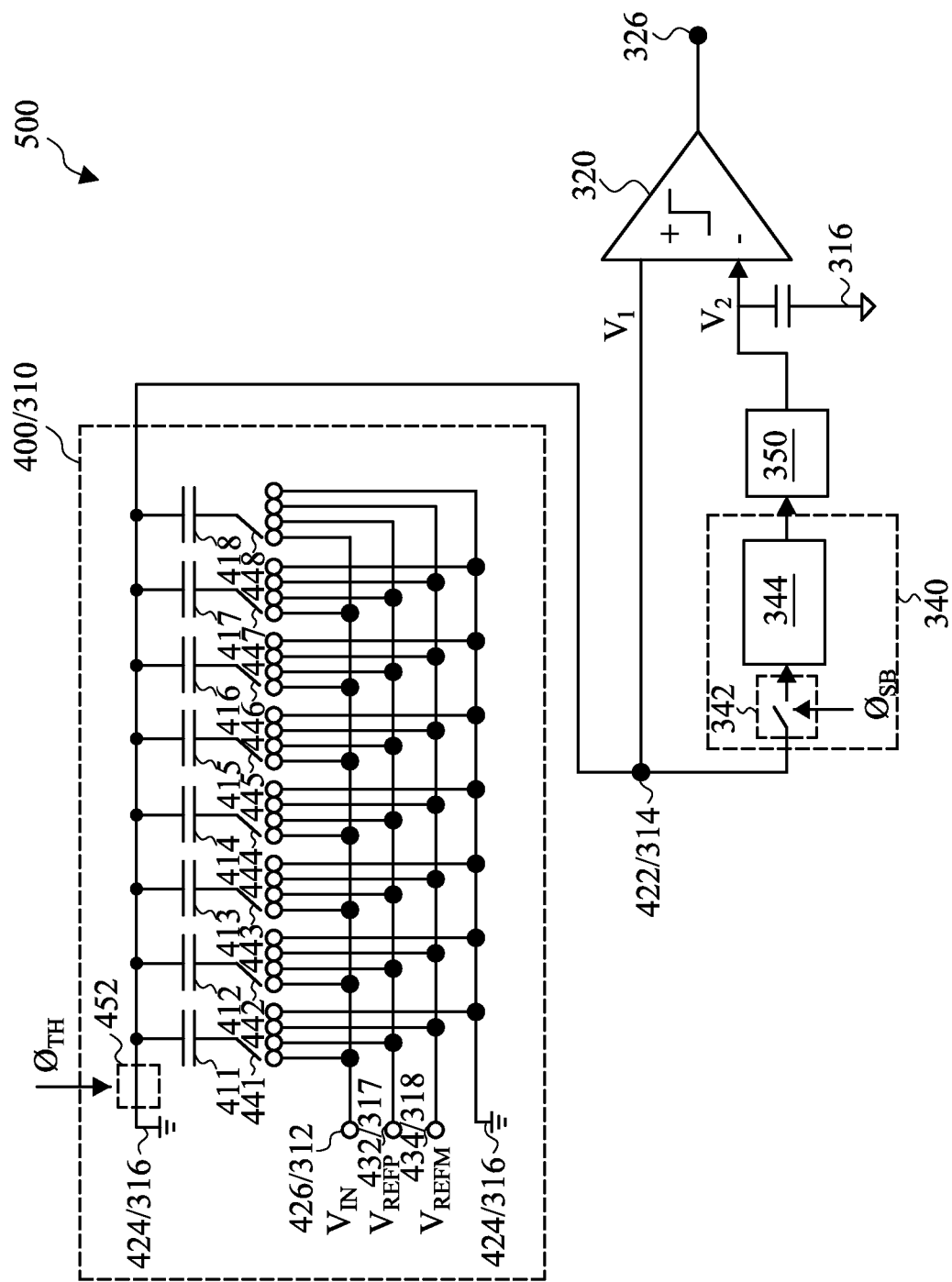
FIGS. 5A-5C are circuit diagrams of a portion of an analog-to-digital conversion circuit at various operating stages in accordance with some embodiments.
Figure 5B:
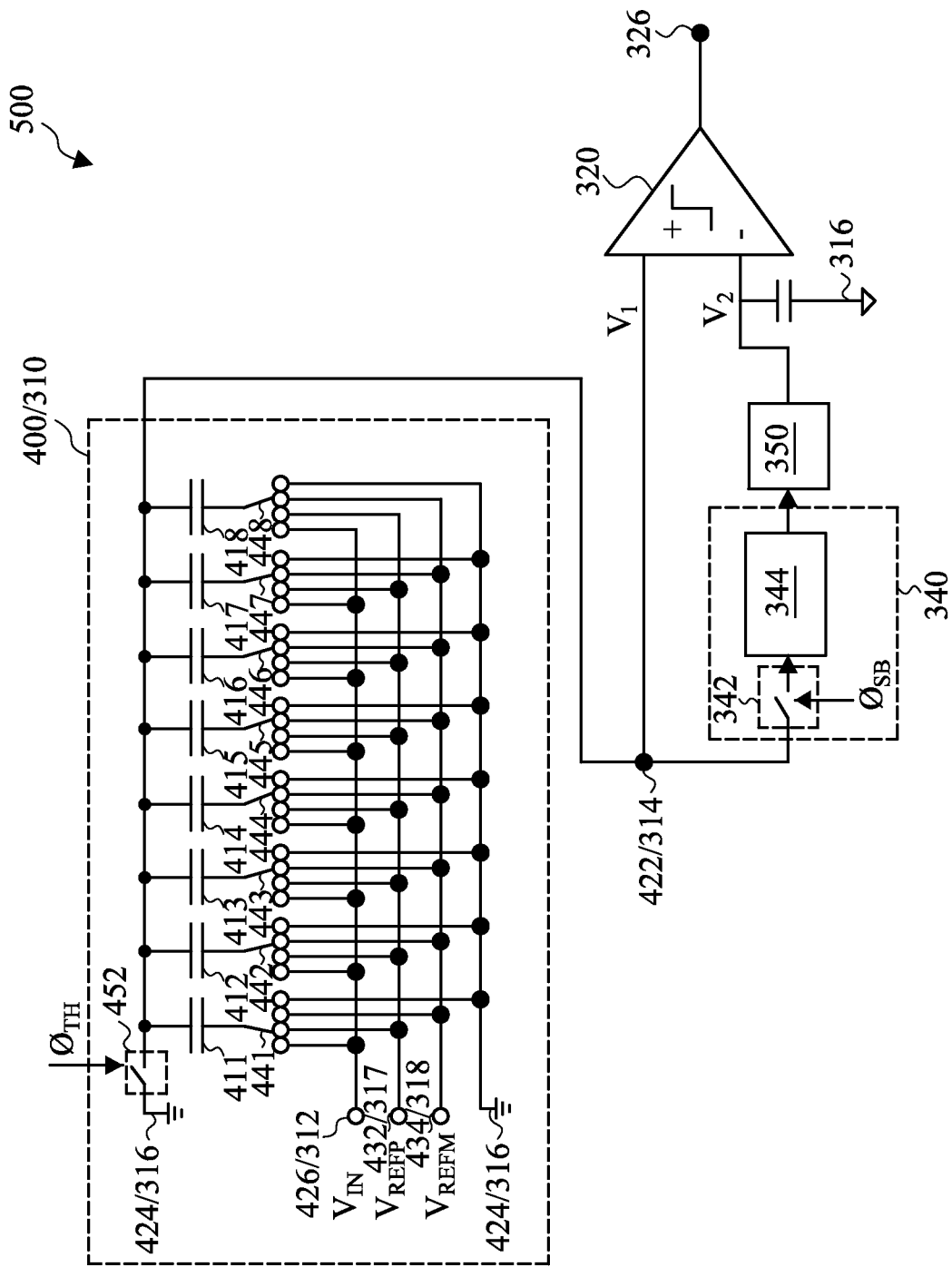
Figure 5C:
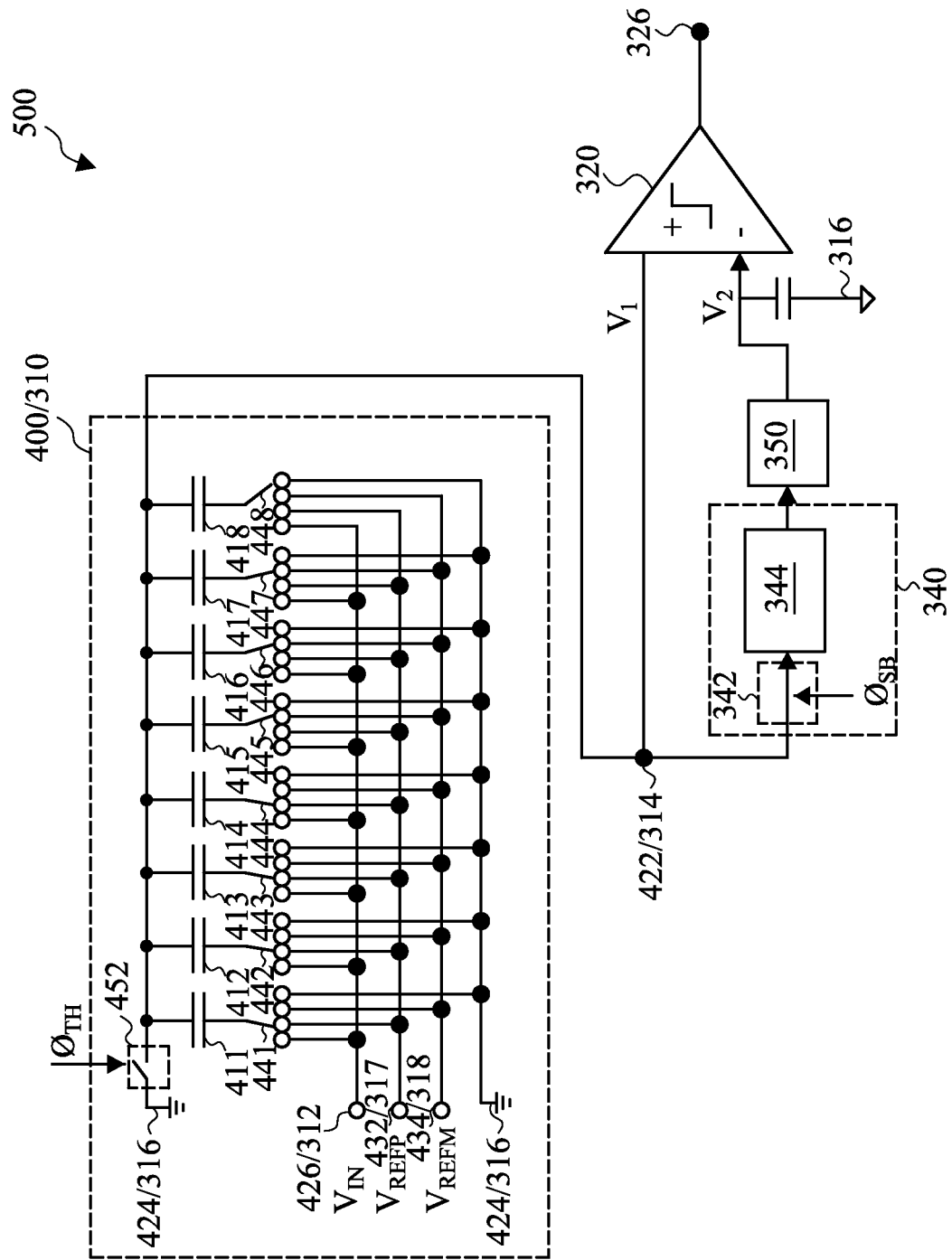

FIGS. 5A-5C are circuit diagrams of a portion of an analog-to-digital (A/D) conversion circuit 500 at various operating stages in accordance with some embodiments. In some embodiments, A/D conversion circuit 500 corresponds to A/D conversion circuit 300, and the capacitor array 310 thereof is implemented based on capacitor array 400. The components in FIGS. 5A-5C that are the same or similar to those in FIGS. 3 and 4 are given the same reference numbers, and detailed description thereof is omitted. A component in FIGS. 5A-5C that corresponds to components depicted in FIGS. 3 and 4 is labeled with both reference numbers used in FIGS. 3 and 4.

FIG. 5A is a circuit diagram of a portion of A/D conversion circuit 500 at a track-and-sample stage corresponding to pulse 212 in FIG. 2. At the track-and-sample stage, switching device 452 is set to electrically couple node 422 and node 424 in response to the activation of a control signal corresponding to pulse 212 of timing signal $\varphi_{TH}$. Also, switching devices 441-448 are set to electrically couple the second ends of capacitive devices 411-418 to node 426 to receive input signal $V_{IN}$. At the end of the track-and-sample stage, capacitive devices 411-418 are charged to have a theoretical estimated total electrical charge of $-2C \cdot Vin$, where Vin represents the voltage level of input signal $V_{IN}$ sampled during the track-and-sample stage.

Also, switched buffer 340 includes a switch 342 and a buffer 344. During the track-and-sample stage, switch 342 is set to electrically decouple node 314 from buffer 344. Therefore, during the track-and-sample stage, buffer 344 still holds a residue voltage level from a previous sampling cycle (e.g., cycle $S_{m-1}$), and voltage V2 has the filtered residue voltage level based on the previous residue voltage level.

FIG. 5B is a circuit diagram of a portion of A/D conversion circuit 500 at a first-bit conversion stage corresponding to pulse 222[1] of timing signal $\varphi_{DA}$ in FIG. 2. At the first-bit conversion stage, switching device 452 is set to electrically decouple node 422 and node 424 in response to the timing signal φ$_{TH}$. Also, switching device 441 is set to electrically couple the second end of capacitive device 411 to node 432 to receive first reference voltage V$_{REFP}$. Switching devices 442-448 are set to electrically couple the second ends of capacitive device 412-418 to node 434 to receive second reference voltage V$_{REFP}$. Therefore, the voltage level at node 422 becomes −Vin+½V$_{REF}$, where V$_{REF}$ is the voltage level difference between voltage V$_{REFP}$ and voltage V$_{REFM}$. Meanwhile, voltage V2 has the filtered residue voltage level (also labeled as Vres') based on the previous residue voltage level. Therefore, comparator 320 compares −Vin+½V$_{REF}$ and Vres' and generate a comparison result at node 326. For example, the comparison result is a logical high value if −Vin+½V$_{REF}$>Vres' and a logical low value if −Vin+½V$_{REF}$<Vres'. In other words, the comparison result represents a polarity of Vin−½V$_{REF}$−Vres'.

After SAR controller 330 receives the comparison result, SAR controller 330 sets a most-significant bit (MSB) of an N-bit logical value as "1" if Vin>½V$_{REF}$+Vres' and as "0" if Vin<½V$_{REF}$+Vres'. Also, for the next pulse 222[2], switching device 441 will be set to be coupled to node 432 if the MSB is "1" and to node 434 if the MSB is "0". The operation of switching devices 441-448 of capacitor array 400, comparator 320, and SAR controller 330 for the next (N−1) pulses 222[2]-222[N] is similar to the algorithm of known SAR ADC. Detailed description thereof is inferable and is thus omitted.

FIG. 5C is a circuit diagram of a portion of A/D conversion circuit 500 at a residue voltage generation stage corresponding to pulse 224 of timing signal φ$_{DA}$ and pulse 232 of timing signal φ$_{SB}$ in FIG. 2. At the residue voltage generation stage, switching device 452 is still set to electrically decouple node 422 and node 424. Also, switching devices 441-447 are set to selectively couple the second ends of capacitive devices 411-417 to node 432 or 434 depending on the final N-bit logical value determined by SAR controller 330. For example, in FIG. 5C, N is 7, and the final N-bit value is "1111000." Therefore, switching devices 441-444 are set to electrically couple the second ends of capacitive devices 411-414 to node 432, and switching devices 445-447 are set to electrically coupled the second ends of capacitive devices 415-417 to node 434. As a result, the voltage level at node 422 is Vin−V$_{Pc}$, where V$_{Pc}$ is the voltage level of the reconstructed voltage based on the final N-bit logical value.

Subsequently in response to a control signal corresponding to pulse 232 of timing signal φ$_{SB}$, switch 342 is set to electrically couple node 314 with buffer 344. Buffer 344 samples and holds an output voltage level corresponding to voltage level V$_{Pc}$. Loop filter 350 receives voltage level V$_{Pc}$ and generates a filtered residue voltage level based on the residue voltage obtained during the current sampling cycle S$_m$ and for the use of the next sampling cycle S$_{m+1}$.

Figure 6A:
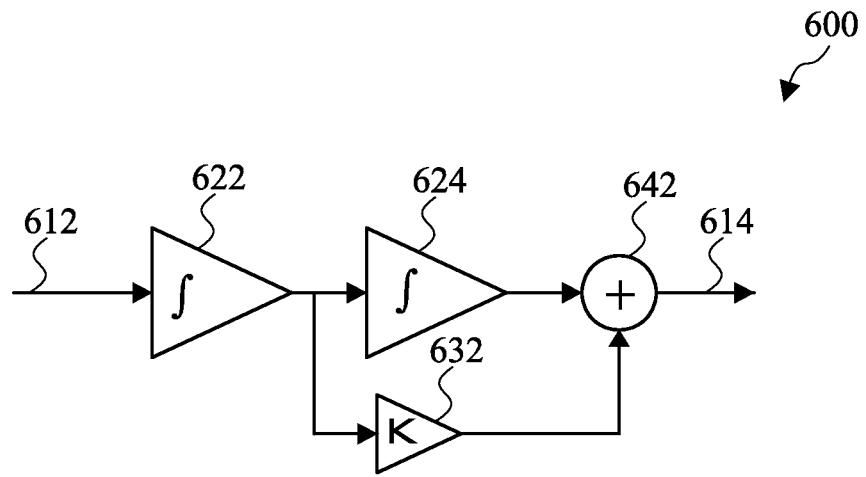
FIG. 6A is a functional block diagram of a loop filter usable in an analog-to-digital conversion circuit in accordance with some embodiments.

FIG. 6A is a functional block diagram of a loop filter 600 usable in an analog-to-digital conversion circuit in accordance with some embodiments. In some embodiments, loop filter 600 is usable as loop filter 350 of A/D conversion circuit 300 or 500.

In some embodiments, loop filter 350 is an analog high-pass filter. For example, loop filter 600 is a second-order high-pass filter. In some embodiments, loop filter 350 is a filter having a filter order greater than 2 or a first-order filter.

Loop filter 600 includes an input node 612, an output node 614, two integrators 622 and 624 coupled in series between input node 612 and output node 614, an amplifier 632 coupled to the output of the integrator 622, and a coupling unit 642 coupled to outputs of integrator 624 and amplifier 632. Input node 612 corresponds to the input terminal of loop filter 350 coupled with switched buffer 340. Output node 614 corresponds to the output terminal of loop filter 350 coupled with inverted input of comparator 320. Amplifier 632 is configured to have a predetermined gain K. In some embodiments, K is set as 2.

Figure 6B:
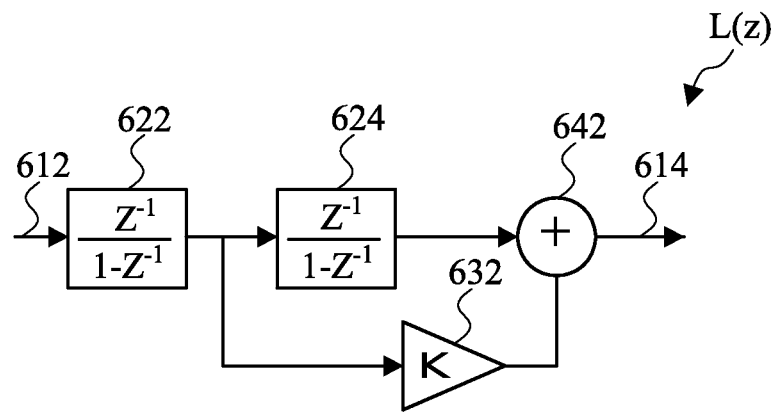
FIG. 6B is a Z-domain block diagram of the loop filter in FIG. 6A in accordance with some embodiments.

FIG. 6B is a Z-domain block diagram of the loop filter in FIG. 6A in accordance with some embodiments. The functional blocks in FIG. 6B variously correspond to components in FIG. 6A and are given the reference numbers of the counterparts thereof. The Z-domain block diagram in FIG. 6B has a Z-domain transfer function L(z). The integrators 622 and 624 are each has a transfer function of $$\frac{z^{-1}}{1-z^{-1}}.$$

Therefore, in the embodiment depicted in FIG. 6A and FIG. 6B, loop filter 600 has a transfer function L(z) meeting the following equation:

$$NTF(z) = \frac{1}{1+L(z)} = (1-z^{-1})^2.$$

Figure 7:
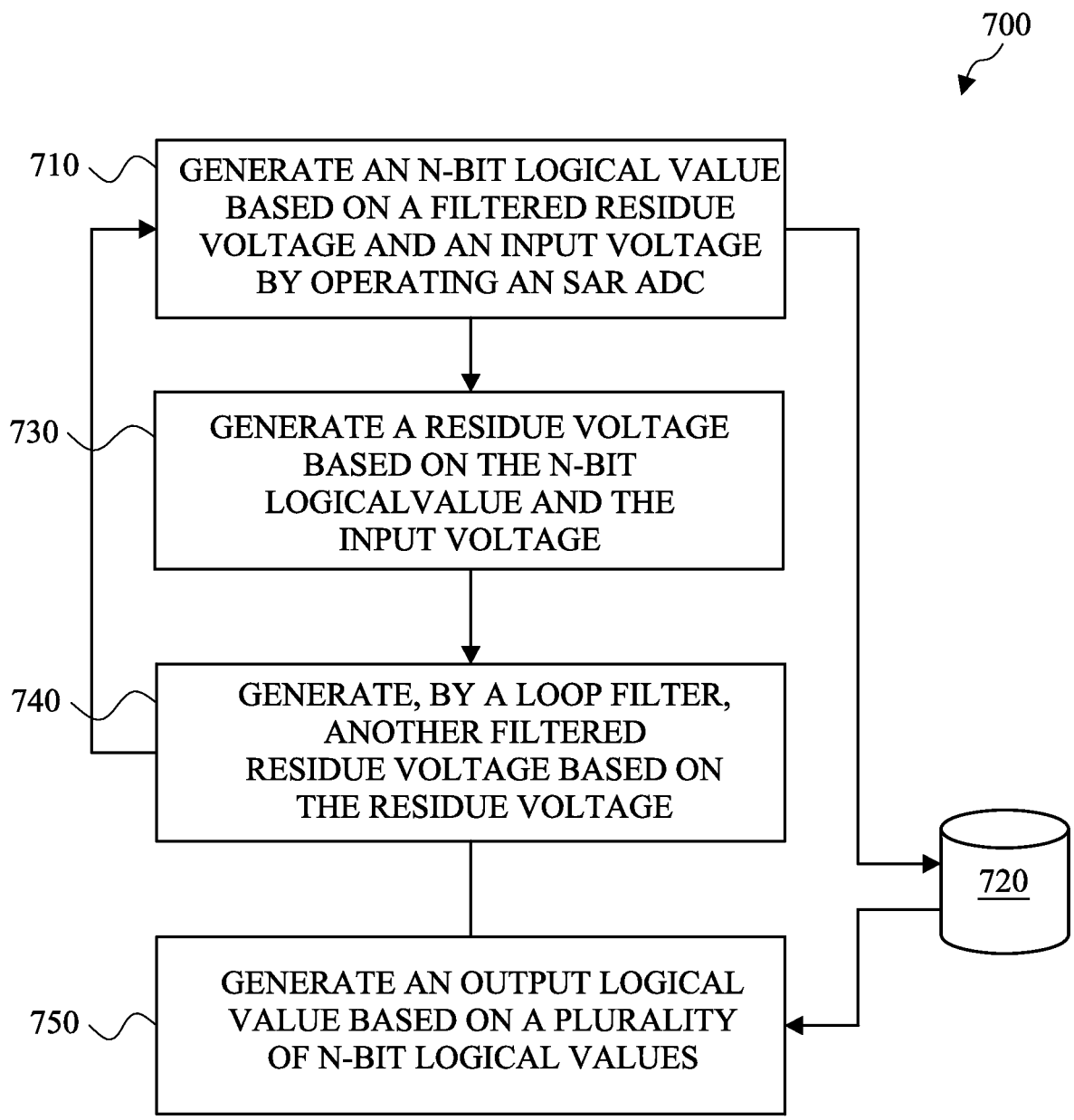
FIG. 7 is a flow chart of a method of operating an analog-to-digital conversion circuit in accordance with some embodiments.

FIG. 7 is a flow chart of a method 700 of operating an analog-to-digital conversion circuit in accordance with some embodiments. In some embodiments, method 700 is usable in conjunction with A/D conversion circuit 300 or 500 consistent with a system 100 of FIG. 1. It is understood that additional operations may be performed before, during, and/or after the method 700 depicted in FIG. 7, and that some other processes may only be briefly described herein.

As depicted in FIGS. 1, 2, 3, and 7, the process 700 starts with operation 710, where, during a sampling cycle S$_m$, an N-bit logical value is generated based on a filtered residue voltage V2/Pd and an input voltage V$_{IN}$/Pb by operating an effectively equivalent N-bit SAR ADC, such as the combination of capacitor array 310, comparator 320, and SAR controller 330. In some embodiments, the generating the N-bit logical value includes charging a capacitor array 310 of the SAR ADC based on the input voltage V$_{IN}$ to sample and hold an voltage level for the sampling cycle S$_m$. The N-bit logical value is stored in a storage device 720. In some embodiments, the storage device 720 is inside controller 330. In some embodiments, the storage device 720 is outside but accessible to controller 330.

The process 700 proceeds to operation 730, where, during the sampling cycle S$_m$, a residue voltage Vres is generated based on the N-bit logical value and the input voltage V$_{IN}$. In some embodiments, operation 730 includes setting the capacitor array 310 of the SAR ADC based on the N-bit logical value in a manner that a voltage level of the residue voltage corresponds to a voltage level of the input voltage minus a reconstructed voltage level corresponding to the N-bit logical value.

The process 700 then proceeds to operation 740, where, during the sampling cycle S$_m$, another filtered residue voltage V2 is generated by a loop filter 350, based on the residue voltage Vres of the sampling cycle S$_m$. The filtered residue voltage V2 generated in operation 740 is usable as a filtered residue voltage of a next sampling cycle S$_{m+1}$. The process

700 proceeds to operation 710 to perform operations 710, 730, and 740 for the next sampling cycle $S_{m+1}$.

Moreover, in operation 750, output filter 360 generates, during an output cycle, an output logical value based on a plurality of N-bit logical values, where each one of the plurality of N-bit logical values corresponding to a different sampling cycle. In some embodiments, the sampling cycle corresponds to a sampling frequency, the output cycle corresponds to an output frequency, and a ratio of the sampling frequency to the output frequency ranges is equal to or greater than 2. Furthermore, in some embodiments, when the effectively equivalent SAR ADC corresponds to an N-bit SAR ADC, output logical value $D_{OUT}$ is an (N+M)-bit logical value. In some embodiments, when N ranges 6 to 8, M ranges 2 to 16.

One aspect of this description relates to an analog-to-digital (A/D) conversion system. The A/D conversion system includes a track-and-hold circuit, a digital-to-analog (D/A) conversion circuit, a comparison circuit and a control circuit. The track-and-hold circuit is configured to output a first signal based on an input signal; the D/A conversion circuit is configured to generate a second signal based on an N-bit logical signal; the comparison circuit is configured to generate a comparison result based on the first signal and the second signal; and the control circuit is configured to generate the N-bit logical signal according to N comparison results from the comparison circuit.

Another aspect of this description relates to an analog-to-digital (A/D) conversion circuit. The A/D conversion circuit includes an N-bit successive approximation register (SAR) analog-to-digital converter (ADC) configured to receive an input voltage, N being a positive integer. The SAR ADC includes a comparator and a controller. The comparator is configured to generate a comparison result based on a first signal and a second signal. The controller is configured to generate an N bit logical signal based on the comparison result after the controller receives N comparison results from the comparator during a sampling cycle.

Still another aspect of this description relates to a method of operating an analog-to-digital (A/D) conversion circuit. The method of operating the A/D conversion circuit includes generating an N-bit logical signal based on a first error signal and an input signal by operating a successive approximation register (SAR) analog-to-digital converter (ADC), and N being a positive integer. The method of operating the A/D conversion circuit further includes generating a second error signal based on the N-bit logical signal and the input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital (A/D) conversion system, comprising:
a track-and-hold circuit configured to output a first signal based on an input signal;
a digital-to-analog (D/A) conversion circuit having an output, and being configured to generate a second signal based on an N-bit logical signal;
a comparison circuit configured to generate a comparison result based on at least the first signal and the second signal;
a control circuit configured to generate the N-bit logical signal according to N comparison results from the comparison circuit;
a loop filter between the D/A conversion circuit and the comparison circuit, and configured to generate a filtered error signal based on an error signal; and
a coupling circuit configured to generate the error signal based on the first signal and the second signal,
wherein the output of the D/A conversion circuit is directly coupled to the coupling circuit and the comparison circuit.

2. The A/D conversion system of claim 1, wherein the comparison circuit is further configured to generate the comparison result based on the first signal, the second signal and the filtered error signal.

3. The A/D conversion system of claim 1, further comprising:
a switched buffer connected to the coupling circuit, the switched buffer configured to sample and hold the error signal, and the control circuit further configured to control a timing of the switched buffer.

4. The A/D conversion system of claim 1, wherein the control circuit is further configured to control a timing of the track-and-hold circuit and the D/A conversion circuit.

5. The A/D conversion system of claim 1, wherein the D/A conversion circuit comprises at least one capacitive device coupled with at least one corresponding switch configured to reconstruct the N-bit logical signal in a form of the second signal representing a reconstructed voltage level.

6. The A/D conversion system of claim 1, further comprising:
an output filter coupled to the control circuit, the output filter configured to receive a third signal from the control circuit, and to output a filtered third signal.

7. The A/D conversion system of claim 1, wherein the N-bit logical signal generated by the control circuit is provided to the D/A conversion circuit to generate the second signal in a next sampling cycle.

8. An analog-to-digital (A/D) conversion circuit, comprising:
an N-bit successive approximation register (SAR) analog-to-digital converter (ADC) configured to receive an input voltage, N being a positive integer, and the SAR ADC comprising:
a comparator configured to generate a comparison result based on a first signal and a second signal;
a controller configured to generate an N bit logical signal based on the comparison result after the controller receives N comparison results from the comparator during a sampling cycle, wherein the second signal is based on the N bit logical signal generated by the controller; and
a capacitor array having an output terminal;
a loop filter coupled to the comparator, and configured to generate a filtered residue signal being usable as the second signal for a next sampling cycle; and
a switched buffer configured to sample and hold a residue signal, and an output of the switched buffer being coupled to the loop filter;

wherein the output terminal of the capacitor array is coupled to a first input of the comparator and an input of the switched buffer.

9. The A/D conversion circuit of claim 8, wherein the capacitor array is configured to generate
the first signal based on the input voltage and at least one reference voltage, and
the residue signal after the comparator generates the N comparison results.

10. The A/D conversion circuit of claim 9, wherein the capacitor array comprises:
(N+1) capacitive devices, each capacitive device of the (N+1) capacitive devices having a first end and a second end, an n-th capacitive device of the (N+1) capacitive devices having a capacitance value of $c/2^{(n-1)}$, where n is a positive integer ranging from 1 to N, and C is a predetermined capacitance value;
a first node electrically coupled to the first ends of the (N+1) capacitive devices;
(N+1) switching devices, each switching device of the (N+1) switching devices coupled to a corresponding second end of each of the (N+1) capacitive devices; and
a first switch coupled between the second ends of the (N+1) capacitive devices and a power supply node having a zero reference voltage.

11. The A/D conversion circuit of claim 10, wherein the first switch is configured to electrically couple the power supply node and the second ends of the (N+1) capacitive devices based on a control signal of the controller.

12. The A/D conversion circuit of claim 9, wherein the switched buffer is further coupled to the capacitor array.

13. The A/D conversion circuit of claim 12, wherein the switched buffer comprises:
a switch coupled to the capacitor array, and configured to be responsive to a control signal received from the controller, and
a buffer coupled to the switch, and configured to hold a voltage level of the residue signal from a previous sampling cycle.

14. The A/D conversion circuit of claim 8, wherein the loop filter has an input and an output, the input of the loop filter being coupled to the output of the switched buffer, and the output of the loop filter being directly coupled to the comparator.

15. The A/D conversion circuit of claim 8, wherein the loop filter is a high-pass filter comprising:

at least one integrator, and
an amplifier.

16. A method of operating an analog-to-digital (A/D) conversion circuit, comprising:
generating, by at least a comparator, an N-bit logical signal based on a first error signal and an input signal by operating a successive approximation register (SAR) analog-to-digital converter (ADC), the comparator being part of the SAR ADC, and N being a positive integer;
generating, by a capacitor array, a second error signal based on the N-bit logical signal and the input signal;
generating, by a switched buffer, a sample and hold residue signal based on the second error signal, the capacitor array having an output terminal coupled to a first input of the comparator and an input of the switched buffer; and
generating, by a loop filter, a third error signal based on the sample and hold residue signal of a sampling cycle, the third error signal being the first error signal of a next sampling cycle, the loop filter being coupled to an output of the switched buffer.

17. The method of claim 16, wherein the generating the N-bit logical signal comprises:
charging the capacitor array based on the input signal to sample and hold a voltage level.

18. The method of claim 17, wherein the generating the second error signal comprises:
setting the capacitor array based on the N-bit logical signal such that a voltage level of the second error signal corresponds to a voltage level of the input signal minus a voltage level corresponding to the N-bit logical signal.

19. The method of claim 16, further comprising:
generating an output logical signal based on a plurality of N-bit logical signals, each one of the plurality of N-bit logical signals corresponding to a different sampling cycle.

20. The A/D conversion system of claim 1, wherein the comparison circuit includes a first input coupled to an output of the track-and-hold circuit, a second input coupled to an output of the loop filter, and a third input coupled to the output of the D/A conversion circuit.

* * * * *